United States Patent
Stark

(10) Patent No.: US 6,691,050 B2
(45) Date of Patent: Feb. 10, 2004

(54) DATA ACQUISITION INSTRUMENT ARCHITECTURE WITH FLEXIBLE DATA ACQUISITION, PROCESSING AND DISPLAY

(75) Inventor: Donald Wilson Stark, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 283 days.

(21) Appl. No.: 09/809,702

(22) Filed: Mar. 14, 2001

(65) Prior Publication Data

US 2003/0036872 A1 Feb. 20, 2003

(51) Int. Cl.[7] .............................................. G01R 13/00
(52) U.S. Cl. ............................ 702/66; 702/67; 702/68; 702/119; 702/127
(58) Field of Search ........................... 702/119, 66, 67, 702/68, 127; 324/97, 121 R

(56) References Cited

U.S. PATENT DOCUMENTS

| | | | | |
|---|---|---|---|---|
| 5,978,742 A | * | 11/1999 | Pickerd | 702/66 |
| 6,050,940 A | * | 4/2000 | Braun et al. | 600/300 |
| 6,459,256 B1 | * | 10/2002 | Pickerd | 324/121 R |
| 6,507,923 B1 | * | 1/2003 | Wall et al. | 714/712 |
| 6,515,665 B1 | * | 2/2003 | Ross | 345/440 |
| 2002/0083128 A1 | * | 6/2002 | Miyajima et al. | 709/203 |
| 2002/0147554 A1 | * | 10/2002 | Pickerd | 702/66 |
| 2003/0014611 A1 | * | 1/2003 | Ferris | 712/35 |

OTHER PUBLICATIONS

*Agilent 8719D, 8720D, and 8722D Microwave Vector Network Analyzers* brochure, available as part No. 5966–4007E, copyright 1998,2000, from Agilent Technologies, Inc.

* cited by examiner

*Primary Examiner*—John Barlow
*Assistant Examiner*—Anthony T. Dougherty

(57) ABSTRACT

An electronic instrument includes instrument hardware. A data acquisition engine schedules time sharing of the instrument hardware. Channel objects act each as a client of the data acquisition engine. The channel objects each included a channel buffer that contains data obtained from the instrument hardware. Measurement objects are each a client of one of the plurality of channel objects. Each measurement object processes data obtained from a channel buffer of a channel object to which the measurement object is a client. Display window objects are each a client of at least one of the plurality of measurement objects, each display window object displaying data processed by any measurement object to which the display window object is a client. Memory within the electronic instrument is allocated among object types to accommodate a user specified mix of object types.

22 Claims, 12 Drawing Sheets

US 6,691,050 B2

DATA ACQUISITION INSTRUMENT ARCHITECTURE WITH FLEXIBLE DATA ACQUISITION, PROCESSING AND DISPLAY

RELATED APPLICATION

The present invention concerns subject matter related to a co-pending patent application Ser. No. 09/796,159 by Dennis John McCarthy and Donald Wilson Stark entitled: SORTING DATA BASED ON DATA ATTRIBUTES FOR DISPLAY IN MULTIPLE DISPLAY WINDOWS and filed on Feb. 28, 2001.

BACKGROUND

The present invention concerns data acquisition and pertains particularly to a data acquisition instrument architecture with flexible data acquisition, processing and display.

Electronic instruments such as network analyzers and spectrum analyzers often allow data acquisition over many channels and include a display capable of displaying one or more traces. For example, Model Number 8719D microwave vector network analyzers are available from Agilent Technologies, Inc., having a business address of 395 Page Mill Road, P.O. Box #10395, Palo Alto, Calif.94306. An 8719D microwave vector network analyzer has a four parameter display that can display all four S-parameters simultaneously. Any combination of reflection and transmission parameters can be displayed, with magnitude, phase, group delay, Smith chart, polar, standing wave ratio (SWR), or time-domain formats. Results may viewed in overlay or split-screen format on a liquid crystal display (LCD) color display with one, two or four graticules. See, for example, *Agilent 8719D. 8720D. and 8722D Microwave Vector Network Analyzers* brochure, available as part number 5966-4007E, copyright 1998,2000, from Agilent Technologies, Inc.

Architecture for prior art electronic instruments tend to limit a user to a fixed set of measurement acquisition, post-processing, and display options. For example, previous analyzers have fixed the number of channels, restricting to user to a fixed maximum number of measurements.

SUMMARY OF THE INVENTION

In accordance with the preferred embodiment of the present invention an electronic instrument includes instrument hardware. A data acquisition engine schedules time sharing of the instrument hardware. Channel objects act each as a client of the data acquisition engine. The channel objects each included a channel buffer that contains data obtained from the instrument hardware. Measurement objects are each a client of one of the plurality of channel objects. Each measurement object processes data obtained from a channel buffer of a channel object to which the measurement object is a client.

In the preferred embodiment, display window objects are each a client of at least one of the plurality of measurement objects, each display window object displaying data processed by any measurement object to which the display window object is a client. Also in the preferred embodiment, memory within the electronic instrument is allocated among object types to accommodate a user specified mix of object types.

The present invention provides a user with flexibility in allocating resources within an electronic instrument.

DESCRIPTION OF THE PREFERRED EMBODIMENT

Figure 1:
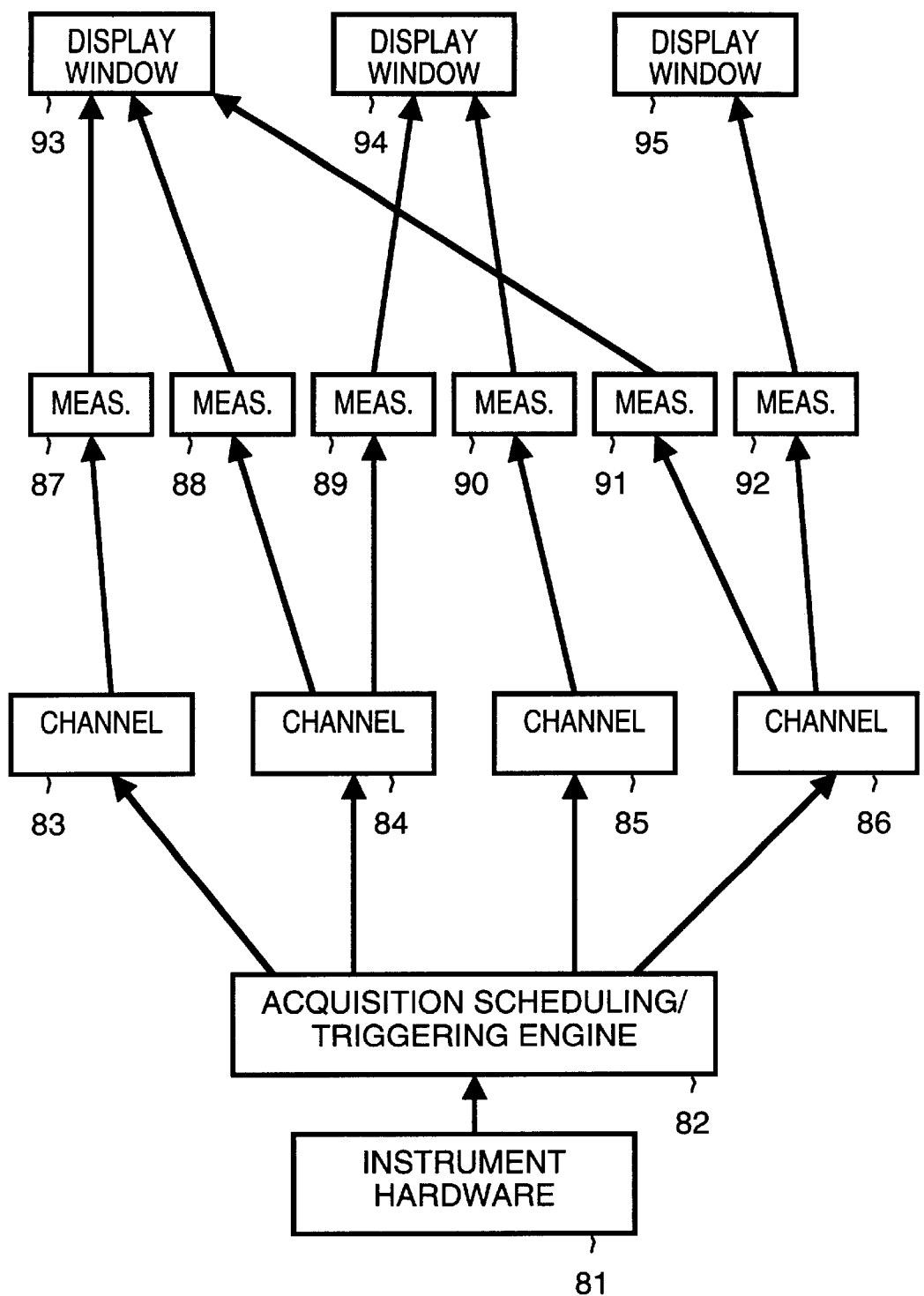
FIG. 1 is a diagram that illustrates use of a three stage data process for operation of a data acquisition instrument architecture, in accordance with a preferred embodiment of the present invention.

FIG. 1 illustrates use of a three stage data process for operation of a data acquisition instrument architecture. The three stages are acquisition, data post-processing, and data display An acquisition scheduling/triggering engine 82 employs up to an arbitrary number N (limited by device memory) dynamically allocated instances of 'virtual' sub-instruments to simultaneously co-exist and share an instrument hardware 81. For example, instrument hardware 81 is the hardware for a network analyzer. Alternatively, instrument hardware 81 can be instrument hardware for another type of instrument. Since instrument hardware 81 is a limited and expensive resource, acquisition scheduling/triggering engine 82 schedules the sub-instrument use of the single hardware resource in a time-shared fashion.

Each sub-instrument acts as a channel object. In FIG. 1, sub-instruments are represented by a channel object 83, a channel object 84, a channel object 85 and a channel object 86. The number of channel objects dynamically created by the software depends on user demands. A user-configurable scheme allows for arming and triggering the channel objects in a data acquisition sequence. This scheme allows an instrument user to simultaneously set up and use an arbitrary number (N) different channel data requests that the system can then execute on instrument hardware 81. The result of these executions are one or more data buffers corresponding to the channel objects. The N channel scheme results in maximum flexibility for the instrument user in the area of data acquisition compared to other schemes that limit the number of acquisition channels.

In data post processing, once the channel data buffers are acquired by the hardware during the acquisition phase, the channel objects are made available to an arbitrary number (N) of measurement objects. A measurement object is a digital computer bound data processing chain not requiring analog hardware. In FIG. 1, the measurement objects are represented by a measurement object 87, a measurement object 88, a measurement object 89, a measurement object 90, a measurement object 91 and a measurement object 92. The number of dynamically created measurement objects depends on the user's requirements, and is independent of the number of channel objects. Thus raw channel data buffers can be processed by N different measurement objects to produce different results, depending on the data processing specified to be performed by each individual measurement object. The benefit here is that the raw channel data was only acquired once from instrument hardware 81, but can be processed multiple (up to N) times to provide the user with multiple near-simultaneous analyses of the same original data, resulting in quicker overall data analysis compared to a system that must acquire data more than once to accomplish the same task.

In data display, once each of the N measurement objects has produced results, those results can be displayed in a display window. The measurement objects can be arbitrarily organized and combined into display windows. This is illustrated in FIG. 1 by a display window 93, a display window 94 and a display window 95. Thus a user has maximum flexibility to configure how measured and post-processed data appears on the instrument display.

The flexibility of the connections between the three stages is achieved by using an event driven update mechanism. This mechanism is what allows an arbitrary number of data clients to "subscribe" to events describing changing data. For example, in this system a measurement object subscribes to a channel object so that the measurement object will be notified when the data that the measurement object is interested in is changed/updated during-the hardware data acquisition process. The same event/subscription mechanism is used between the display and data processing layers as well.

Because of the dynamic nature of how data is measured, processed, and displayed in this architecture, it is necessary to provide names so that portions of the acquisition and processing chain can be addressed and modified (particularly from remote programming environments). Thus a user is allowed to provide a name, or the software automatically generates a descriptive name based on attributes of the data processing chain.

Data is provided by acquisition scheduling/triggering engine 82 via a client/server mechanism where the acquisition scheduling/triggering engine 82 is the server, and clients are an arbitrary number (N) of abstractly defined (in classic object-oriented sense) pieces of software (e.g., channel objects) that want data from the instrument hardware 81.

Acquisition scheduling/triggering engine 82 is responsible for scheduling requests for instrument hardware 81 data made by the clients of acquisition scheduling/triggering engine 82. Acquisition scheduling/triggering engine 82 must time-share instrument hardware 81 among its clients that want data, since in the preferred embodiment, instrument hardware 81 can only do one thing at a time. Acquisition scheduling/triggering engine 82 supports an arbitrary number of clients (limited by available memory). Acquisition scheduling/triggering engine 82 is also responsible for translating high level client requests for data into a command queue (or command list) which is used to generate actual hardware control signals and data digitization operations. The triggering portion of the generated commands lists must change depending on past and present client requests, and trigger signal inputs.

Most operations of acquisition scheduling/triggering engine 82 execute asynchronously with respect to clients of acquisition scheduling/triggering engine 82. This is necessary to allow acquisition scheduling/triggering engine 82 to respond to requests from instrument hardware 81. Asynchronous execution is achieved by providing acquisition scheduling/triggering engine 82 with a thread of execution, and a message queue from which to process instructions and arguments to those instructions. This thread also allows clients of acquisition scheduling/triggering engine 82 to operate asynchronously from acquisition scheduling/ triggering engine 82. This is convenient since given the timesharing and triggering responsibilities of the acquisition scheduling/triggering engine 82, acquisition scheduling/ triggering engine 82, clients could otherwise block for long and/or undetermined amounts of time while interacting with acquisition scheduling/triggering engine 82. Acquisition scheduling/triggering engine 82 includes a state machine, which executes given inputs from clients (from "above") and instrument hardware 81 (from "below").

Acquisition scheduling/triggering engine 82 allows the clients to take a group of related hardware measurement objects in sequence (without scheduling another client in between). This is referred to as an acquisition group. Acquisition scheduling/triggering engine 82 also provides support for multiple triggering modes as applied to the clients, including point trigger, channel object, or global. Global trigger mode means that a received trigger signal input applies to all clients. Channel object trigger mode means that a received trigger signal input applies to the "current" client. Point trigger mode implies channel object trigger mode, and means that a received trigger signal input applies to the next data point only. State machine logic within acquisition scheduling/triggering engine 82 can handle changing between these triggering modes as it applies to its clients and instrument hardware 81 in their respective current states.

Acquisition scheduling/triggering engine 82's ability to handle an arbitrary number of abstractly defined clients allows it to support the concept of a virtual hardware instrument. Basically this means that anyone can build a client to use instrument hardware 81 to take data as though the client were the only client.

Channel objects are a type of client of acquisition scheduling/triggering engine 82. Channel objects contain a high level description of desired measurement objects, such as frequency range, power level, IF bandwidth, number of points to sweep, which receivers to measure, etc. that is compatible with acquisition scheduling/triggering engine 82. The channel objects use acquisition scheduling/ triggering engine 82 to do the work of actually getting the data from instrument hardware 81 that fits a given description. Table 1 below sets out an overview of the basic sequence that acquisition scheduling/triggering engine 82 follows:

TABLE 1

System Startup—initialize hardware. Go to IDLE state.

IDLE state:

1) Check to see if hardware needs calibration. If so, calibrate.
2) Check to see if acquisition scheduling/triggering engine 82 is in the process of taking data for a particular client. If there is more data (additional sweeps) to take for this client, build and load and run a command list for that client, then proceed to either SWEEPING state or SWEEPING_NOT_TRIGGERED state depending on triggering setup.
3) If there is no client currently being serviced: Evaluate the client list to see whether there is a client that needs to take data. If so, (based on triggering mode and some client state), begin that process of taking data (prepare a command list consistent with the client's request) and change to either the SWEEPING state or SWEEPING_NOT_TRIGGERED state. Note that evaluating this client list is an optimization of the timeshared hardware usage. Clients that are ready to run are scheduled to run. Clients that are not ready are passed over until they are.

TABLE 1-continued

System Startup—initialize hardware. Go to IDLE state.

SWEEPING state:

1) As data is taken by instrument hardware 81, return that data to the current client. Since these clients are arbitrary and dynamic in nature a memory buffering scheme has been implemented to maximize data throughput without delivering data to compile-time fixed memory locations. This scheme maximizes overall data throughput whether there is 1, 2, or N clients currently using acquisition scheduling/triggering engine 82.
2) If the sweep is aborted for any reason (hardware errors, or client interruption), return to IDLE state.
3) When the sweep completes, notify client of this fact, and return to IDLE state.
SWEEPING_NOT_TRIGGERED state:

1) Wait for an external (pos. or neg. rear panel) trigger signal input, or an internally generated signal, such as a user pressing a button. When it arrives go to SWEEPING state.
2) If the signal does not arrive, but instead the sweep is aborted, return to IDLE state.
All states:

During the IDLE, SWEEPING, and SWEEPING_NOT_TRIGGERED states, acquisition scheduling/triggering engine 82 must accommodate client requests such as adding and removing clients, and changing the trigger mode and trigger signal. Depending on the state, different actions are taken which may include aborting current sweep operations, reordering the client list.

FIG. 2, FIG. 3, FIG. 4, FIG. 5, FIG. 6, FIG. 7 and FIG. 8 are flow diagrams that provide additional detail to the basic sequence that acquisition scheduling/triggering engine 82 follows.

Figure 2:
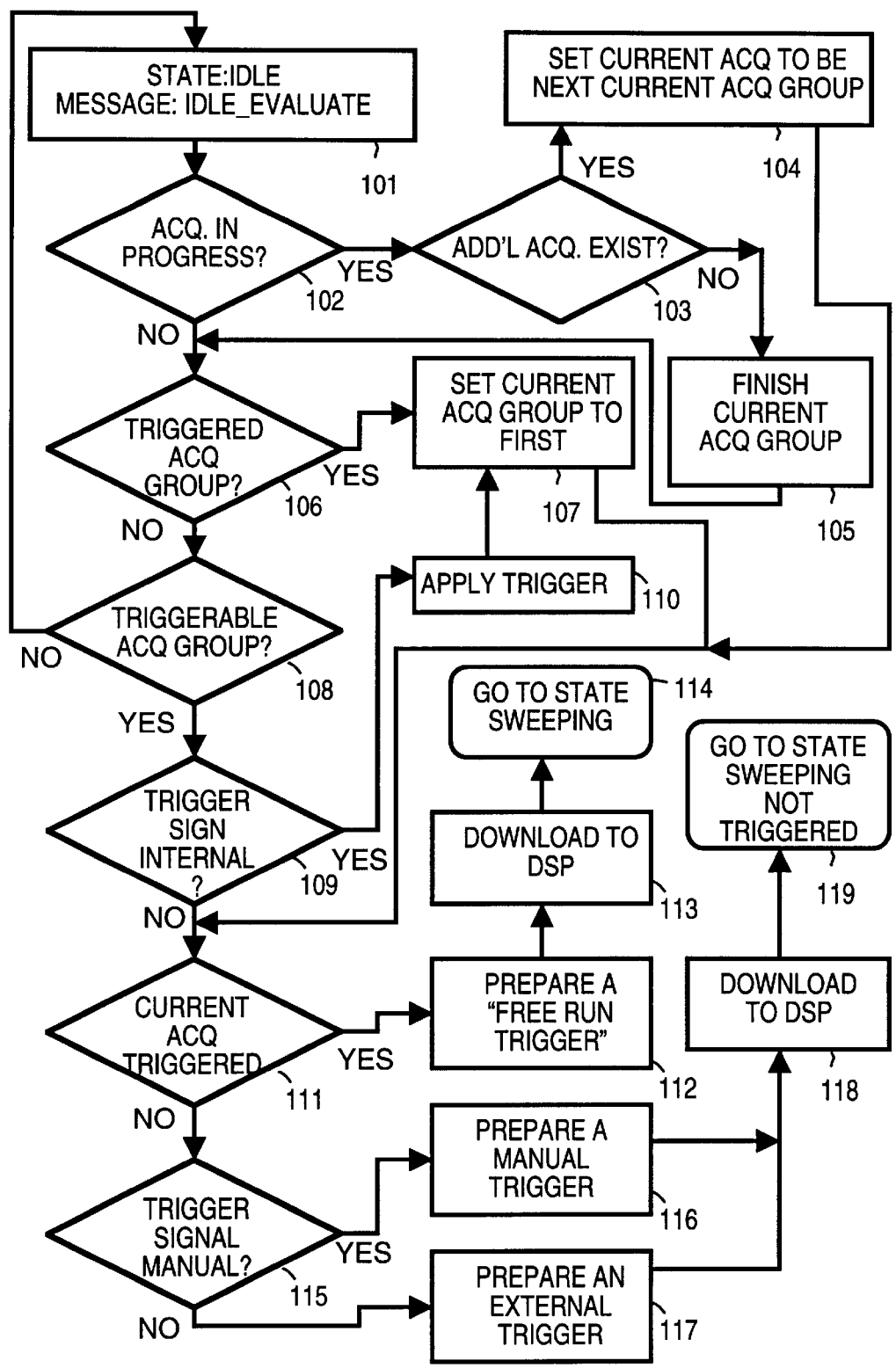
FIG. 2, FIG. 3, FIG. 4, FIG. 5, FIG. 6, FIG. 7 and FIG. 8 are flow diagrams that illustrate state transitions for data acquisition in accordance with a preferred embodiment of the present invention.

In FIG. 2, in a step 101, acquisition scheduling/triggering engine 82 is in the IDLE state and receives an IDLE_EVALUATE message from its queue. In a step 102, acquisition scheduling/triggering engine 82 determines whether an acquisition group is in progress. If so, in a step 103, acquisition scheduling/triggering engine 82 determines whether additional acquisitions exist for this group. If so, in a step 104, acquisition scheduling/triggering engine 82 sets the current acquisition to be the next in the current acquisition group and jumps to a step 111.

If in step 103, acquisition scheduling/triggering engine 82 determines additional acquisitions do not exist for this group, in a step 105, acquisition scheduling/triggering engine 82 finishes the current acquisition group.

In a step 106, acquisition scheduling/triggering engine 82 determines whether there is a triggered acquisition group. If so, in a step 107, acquisition scheduling/triggering engine 82 sets the current acquisition group to be the first triggered acquisition group. Acquisition scheduling/triggering engine 82 also sets the current acquisition to be the first acquisition in that acquisition group and jumps to step 111.

In a step 106, acquisition scheduling/triggering engine 82 determines there is not a triggered acquisition group, in a step 108, acquisition scheduling/triggering engine 82 determines whether there is a triggerable acquisition group. If not, acquisition scheduling/triggering engine 82 returns to the IDLE state.

If in step 108, acquisition scheduling/triggering engine 82 determines there is a triggered acquisition group, in a step 109, acquisition scheduling/triggering engine 82 determines whether the trigger signal is internal. If so, in a step 110, acquisition scheduling/triggering engine 82 applies the trigger to channel objects according to trigger type (global or channel object) and jumps to step 107.

If in step 109, acquisition scheduling/triggering engine 82 determines the trigger signal is not internal, in step 111, acquisition scheduling/triggering engine 82 determines whether the current acquisition is triggered. If so, in a step 112, acquisition scheduling/triggering engine 82 prepares a "free-run trigger" acquisition on a digital signal processor (DSP). The DSP acts as a slave processor to the main CPU of the instruments. The DSP has special hardware optimized for performing certain mathematical operations on arrays of data at high speed. This allows performance of digital filtering types of operations faster than general purpose digital processors. The DSP executes commands from a command list.

In a step 113, acquisition scheduling/triggering engine 82 downloads to the DSP and runs on the DSP. In a step 114, acquisition scheduling/triggering engine 82 enters the state: SWEEPING.

If in step 111, acquisition scheduling/triggering engine 82 determines the current acquisition is not triggered, acquisition scheduling/triggering engine 82 determines whether the trigger signal is manual or external. If manual, in a step 116, acquisition scheduling/triggering engine 82 prepares a manual trigger acquisition on the DSP. If external, in a step 117, acquisition scheduling/triggering engine 82 prepares an external trigger acquisition on the DSP. In a step 118, acquisition scheduling/triggering engine 82 downloads to the DSP and runs on the DSP. In a step 119, acquisition scheduling/triggering engine 82 enters the state: SWEEPING_NOT_TRIGGERED.

Figure 3:
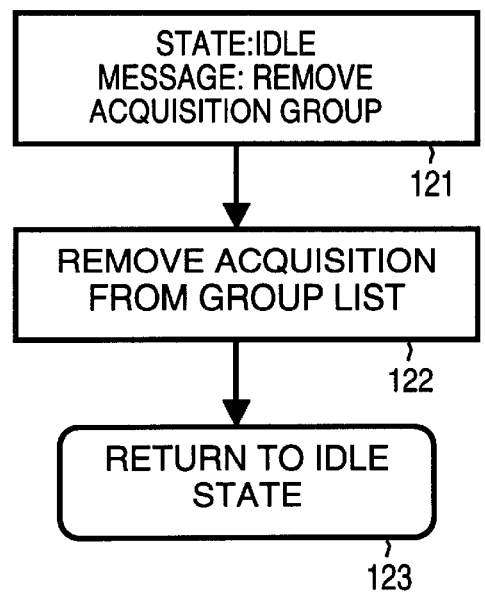
Figure 3:
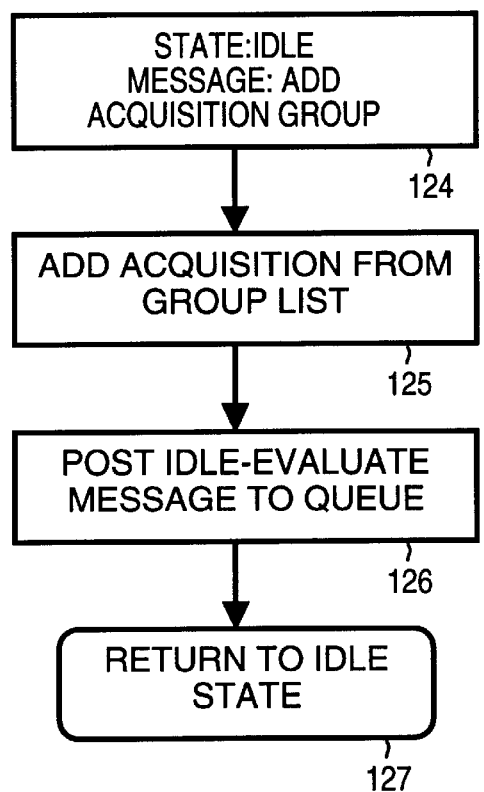

In FIG. 3, in a step 121, acquisition scheduling/triggering engine 82 is in the IDLE state and receives a REMOVE ACQUISITION GROUP message from its queue. In a step 122, acquisition scheduling/triggering engine 82 removes the acquisition group from its list. In a step 123, acquisition scheduling/triggering engine 82 returns to the IDLE state.

In a step 124, acquisition scheduling/triggering engine 82 is in the IDLE state and receives an ADD ACQUISITION GROUP message from its queue. In a step 125, acquisition scheduling/triggering engine 82 adds an acquisition group to its list. In a step 126, acquisition scheduling/triggering engine 82 posts an IDLE_EVALUATE message to the queue. In a step 127, acquisition scheduling/triggering engine 82 returns to the IDLE state.

Figure 4:
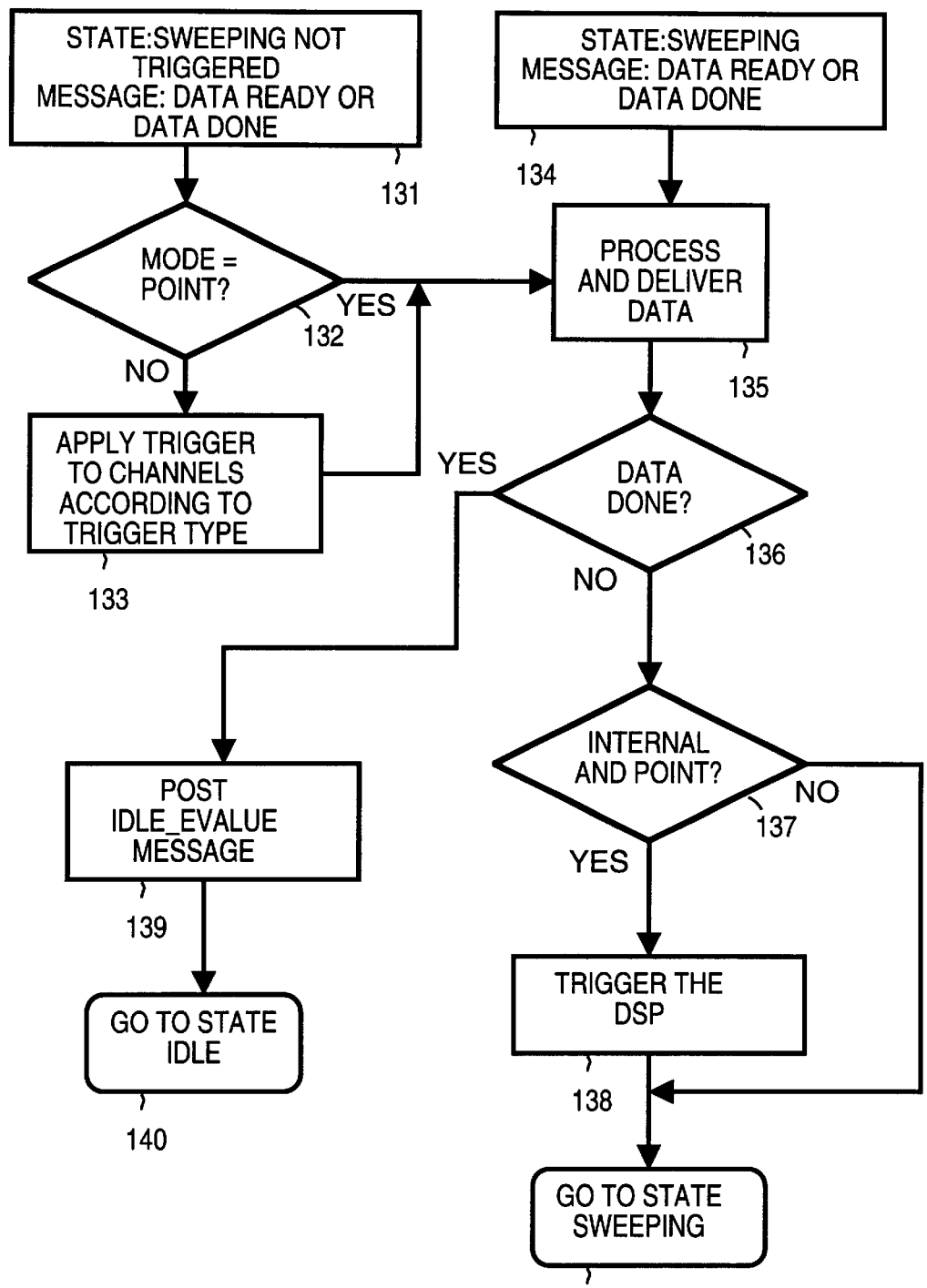

In FIG. 4, in a step 131, acquisition scheduling/triggering engine 82 is in the SWEEPING_NOT_TRIGGERED state and receives a DATA READY or a DATA DONE message from its queue. In a step 132, acquisition scheduling/triggering engine 82 determines whether the current acquisition trigger mode is equal to point. If not, in a step 133, acquisition scheduling/triggering engine 82 applies trigger to channel objects according to trigger type (global or channel object) and jumps to a step 135.

In a step 134, acquisition scheduling/triggering engine 82 is in the SWEEPING state and receives a DATA READY or a DATA DONE message from its queue. In step 135, acquisition scheduling/triggering engine 82 processes data and delivers the data to the client.

In a step 136, acquisition scheduling/triggering engine 82 evaluates a next message to determine whether it is a DATA DONE message or a DATA READY message. If it is a DATA DONE message, in a step 139, acquisition scheduling/triggering engine 82 posts an IDLE_

EVALUATE message. In a step 140, acquisition scheduling/triggering engine 82 goes to the IDLE state.

If in step 136 the message is a DATA READY message, in a step 137, acquisition scheduling/triggering engine 82 determines whether the trigger signal is equal to internal and the trigger mode is equal to point. If so, in a step 138, acquisition scheduling/triggering engine 82 triggers the DSP. In a step 141, acquisition scheduling/triggering engine 82 returns to the SWEEPING state.

One unique aspect of the preferred embodiment is the existence of two levels to the triggering system. The first level is the "trigger mode", which can be "global", "channel", or "point". Global triggering means that incoming trigger signals are applied to all clients of acquisition scheduling/triggering engine 82 (i.e., applied to all channels). Channel triggering means that the "current" client of acquisition scheduling/triggering engine 82 gets an incoming trigger signal. Point triggering means that the "current" client of acquisition scheduling/triggering engine 82 gets the trigger and the response is to take only the next data point (and not the whole "sweep" of data points).

In addition to this, there is an aspect that is performed at a second level. The client of acquisition scheduling/triggering engine 82 (i.e., a channel object) also plays a role in the triggering process. This is necessary in a system with an arbitrary number of clients. This is because when there are a large number of clients (large N), a triggering system can become cumbersome. The "second level" allows the client of acquisition scheduling/triggering engine 82 to assert policy as to whether or not it is "triggerable". If a client of acquisition scheduling/triggering engine 82 is not triggerable, then even if a trigger is applied (for example in global mode) to that particular client, it does not become triggered.

This triggering tie in to the client level allows clients to define their own policy as to how they respond to triggers to the acquisition scheduling/triggering engine 82 layer. For example, a client of scheduling/triggering engine 82 (i.e., a channel object) may decide that it wants to make (for example) eight measurements so that the results of those eight measurements can be averaged together. The channel object might set its policy to accept eight triggers from the acquisition scheduling/triggering engine 82 layer, then revert to a not triggerable state. In actual implementation, channel objects have four such policy settings, corresponding to integer values that represent a count of triggers to accept before moving to the not-triggerable state. In the preferred embodiment of the present invention, clients of scheduling/triggering engine 82 are able to set at any of the four policy settings. The four settings are described in Table 2 below. The four settings are implemented in terms of a count that is decremented (except for policy level 4) after each trigger is accepted from acquisition scheduling/triggering engine 82.

TABLE 2

Policy Level 1:

(Count = 0) This is "Hold" mode. The user can set this to halt data taking for a particular channel object while data taking for other channel objects continues. Hold mode effectively means that a channel object is in the not triggerable state as far as acquisition scheduling/triggering engine 82 is concerned. (Non-0 means triggerable to acquisition scheduling/triggering engine 82, and 0 means non-triggerable to acquisition scheduling/triggering engine 82.)

TABLE 2-continued

Policy Level 2:

(Count = 1) This is "Single" mode. The user can set this to instruct the channel object to accept one trigger from acquisition scheduling/triggering engine 82, and thus take one set of measurement buffers, then go to Hold (the count is decremented).

Policy Level 3:

(Count is greater than 1) This is "Group" mode. The user can choose this to take some number N of sweeps before reverting to "Hold" mode. This is like the eight trigger case discussed just above.

Policy Level 4:

(Count = −1) This is "Continuous" mode. The −1 represents "infinity", so the user can set this to cause the channel object to always accept triggers from the acquisition scheduling/triggering engine 82 layer. The −1 is a special value that is not decremented after receiving a trigger. This effectively disables this channel object's participation in acquisition scheduling/triggering engine 82's triggering scheme, as it will never be not triggerable in this mode.)

As discussed above, the triggering mechanism is implemented in two layers: the acquisition scheduling/triggering engine 82 layer, and the acquisition scheduling/triggering engine 82's client layer (i.e. by the channel objects). Layering the triggering in two layers allows the client to be involved. This two layer mechanism is implemented in two stages.

In the first stage, acquisition scheduling/triggering engine 82 applies the trigger to the clients of acquisition scheduling/triggering engine 82 clients according to the global/channel/point setting. The clients of acquisition scheduling/triggering engine 82 are either in a triggered or not triggered state after this, depending on whether acquisition scheduling/triggering engine 82 applied the trigger to a particular client and whether or not that client accepted the trigger that may have been applied to it according to its policy (whether it was triggerable or not, as discussed above).

In the second stage, acquisition scheduling/triggering engine 82 looks for any and all clients that are marked as triggered, and executes their measurement requests (Acquisition Groups) in series on instrument hardware 81. When a particular client that was marked as "triggered" runs on instrument hardware 81, the client is marked as "not triggered", indicating that the trigger has been executed for that client.

Figure 5:
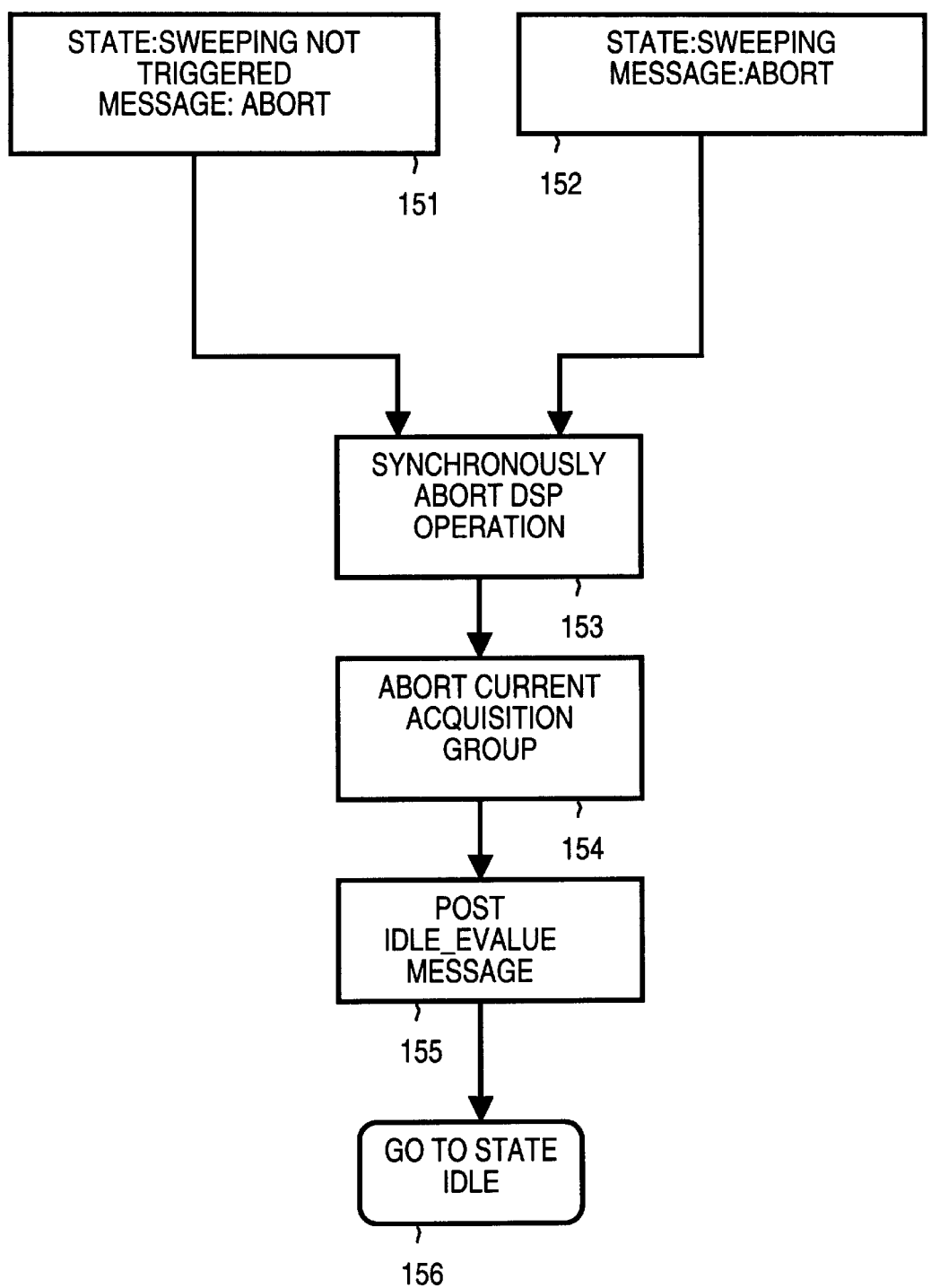

In FIG. 5, in a step 151, acquisition scheduling/triggering engine 82 is in the SWEEPING_NOT_TRIGGERED state and receives an ABORT message from its queue. Likewise in a step 152, acquisition scheduling/triggering engine 82 is in the SWEEPING state and receives an ABORT message from its queue. In a step 153, acquisition scheduling/triggering engine 82 synchronously aborts the DSP operation. In a step 154, acquisition scheduling/triggering engine 82 aborts the current acquisition group. In a step 155, acquisition scheduling/triggering engine 82 posts an IDLE_EVALUATE message. In a step 156, acquisition scheduling/triggering engine 82 goes to the IDLE state.

Figure 6:
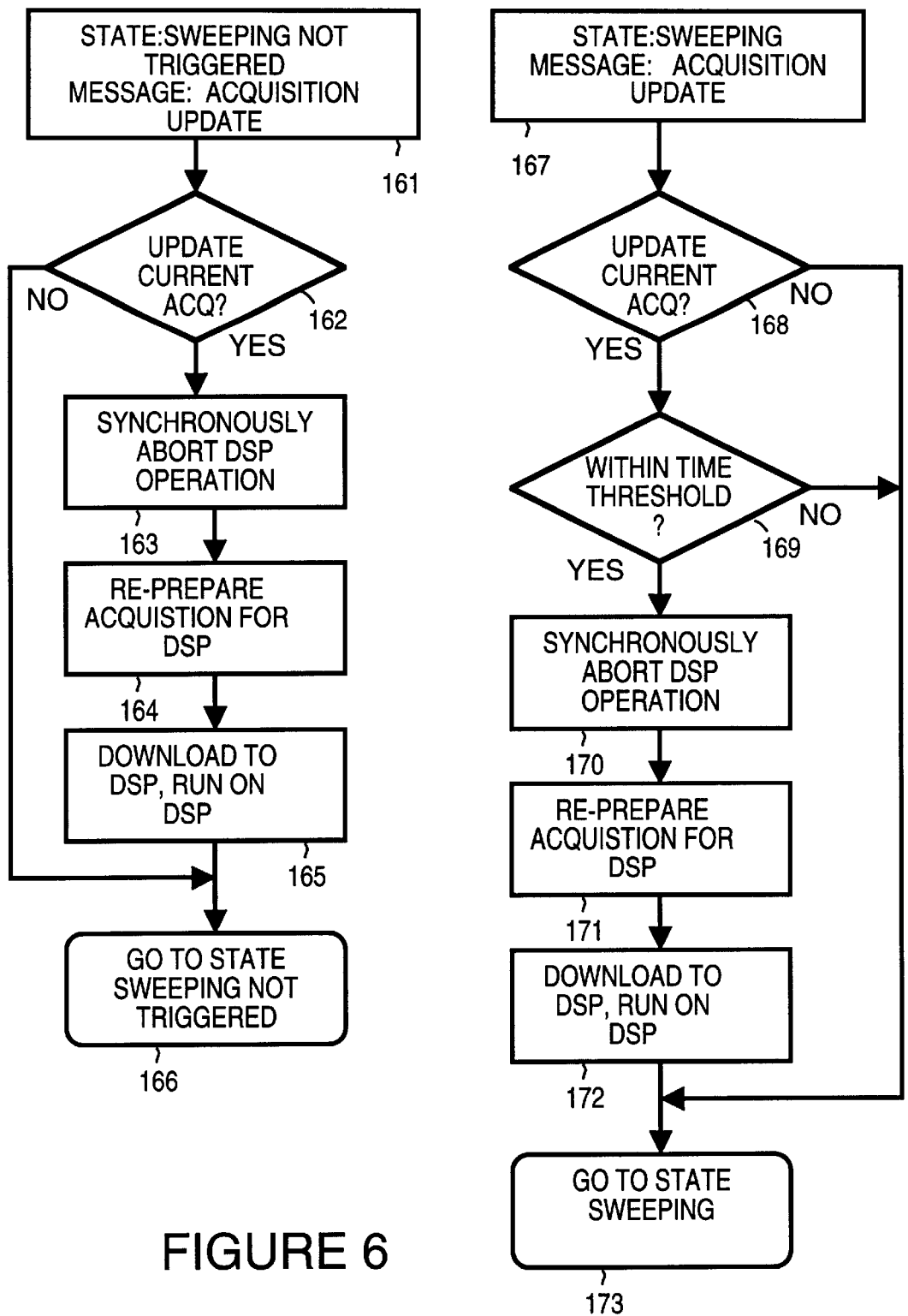

In FIG. 6, in a step 161, acquisition scheduling/triggering engine 82 is in the SWEEPING_NOT_TRIGGERED state and receives an ACQUISITION UPDATE message from its queue. In a step 162, acquisition scheduling/triggering engine 82 determines whether the current acquisition is the one being updated. If not, in a step 166, acquisition scheduling/triggering engine 82 returns to the SWEEPING_NOT_TRIGGERED state.

If in step 162, acquisition scheduling/triggering engine 82 determines the current acquisition is the one being updated, in a step 163 acquisition scheduling/triggering engine 82 synchronously aborts the DSP operation. In a step 164, acquisition scheduling/triggering engine 82 re-prepares acquisition for DSP based on the changed acquisition specification. In a step 165, acquisition scheduling/triggering engine 82 downloads to DSP and then runs on DSP. Acquisition scheduling/triggering engine 82 also asserts the trigger signal is manual or external. In step 166, acquisition scheduling/triggering engine 82 returns to the SWEEPING_NOT_TRIGGERED state.

In a step 167, acquisition scheduling/triggering engine 82 is in the SWEEPING state and receives an ACQUISITION UPDATE message from its queue. In a step 168, acquisition scheduling/triggering engine 82 determines whether the current acquisition is the one being updated. If not, in a step 173, acquisition scheduling/triggering engine 82 returns to the SWEEPING state.

If in step 168, acquisition scheduling/triggering engine 82 determines the current acquisition is the one being updated, in a step 169, acquisition scheduling/triggering engine 82 determines whether the time until the end of the acquisition is greater than the specified time threshold. If not, in step 173, acquisition scheduling/triggering engine 82 returns to the SWEEPING state.

If in step 169, acquisition scheduling/triggering engine 82 determines the time until the end of the acquisition is greater than the specified time threshold, in a step 170 acquisition scheduling/triggering engine 82 synchronously aborts the DSP operation. In a step 171, acquisition scheduling/triggering engine 82 re-prepares acquisition for DSP based on the changed acquisition specification. In a step 172, acquisition scheduling/triggering engine 82 downloads to DSP and then runs on DSP. Acquisition scheduling/triggering engine 82 also asserts the trigger signal is internal. In step 173, acquisition scheduling/triggering engine 82 returns to the SWEEPING state.

Figure 7:
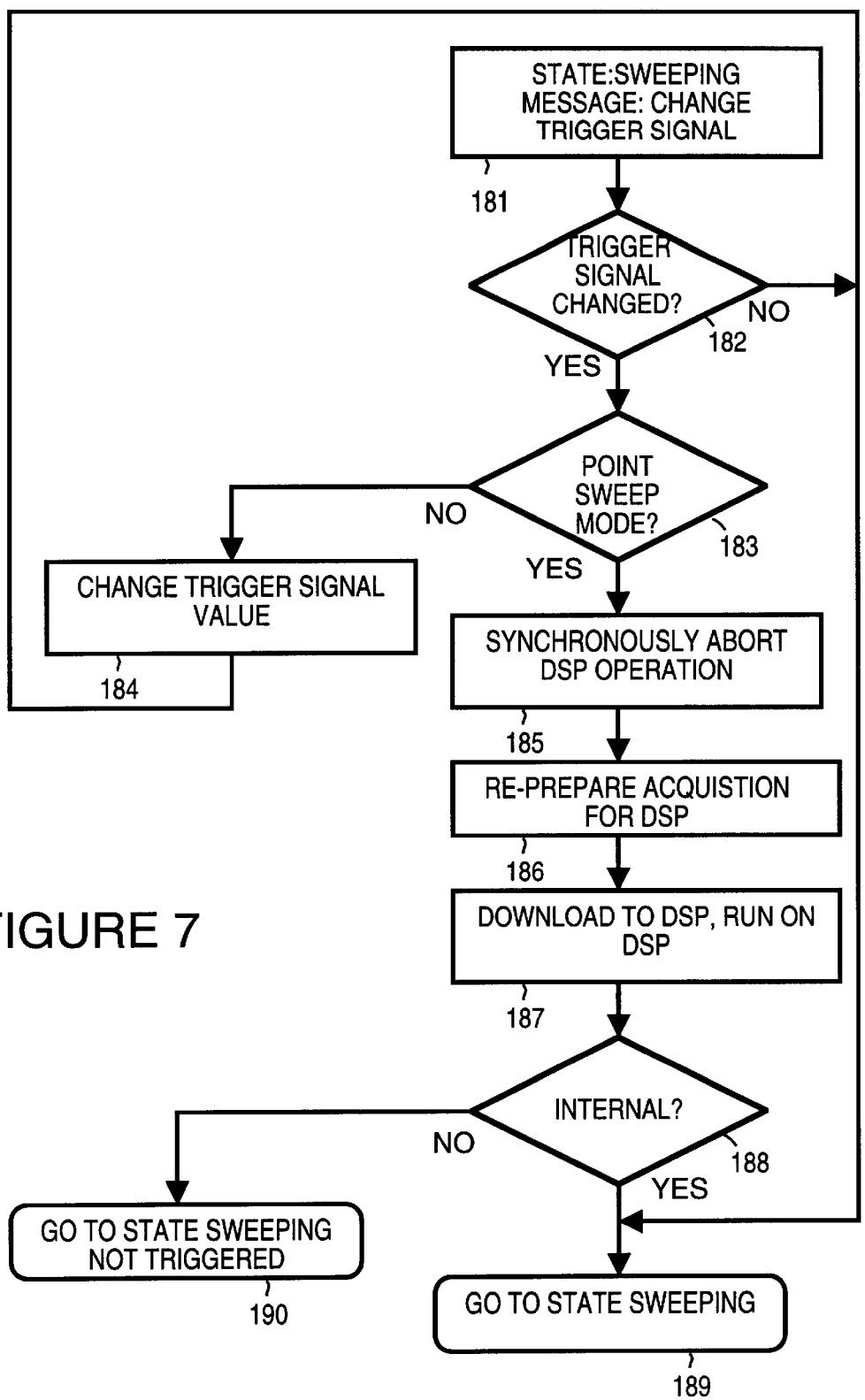

In FIG. 7, in a step 181, acquisition scheduling/triggering engine 82 is in the SWEEPING state and receives a CHANGE TRIGGER SIGNAL message from its queue. In a step 182, acquisition scheduling/triggering engine 82 determines whether the trigger signal has changed. If not, in a step 189, acquisition scheduling/triggering engine 82 returns to the SWEEPING state.

If in step 182, acquisition scheduling/triggering engine 82 determines the trigger signal has changed, in a step 183 acquisition scheduling/triggering engine 82 determines whether the current acquisition is in point sweep mode. If so, in a step 184, acquisition scheduling/triggering engine 82 changes the trigger signal value to be applied when the current batch of triggered signals completes. In step 189, acquisition scheduling/triggering engine 82 returns to the SWEEPING state.

If in step 183, acquisition scheduling/triggering engine 82 determines the current acquisition is in point sweep mode, in a step 185 acquisition scheduling/triggering engine 82 synchronously aborts the DSP operation. In a step 186, acquisition scheduling/triggering engine 82 re-prepares acquisition for DSP based on the changed acquisition specification. In a step 187, acquisition scheduling/triggering engine 82 downloads to DSP and then runs on DSP. In a step 188, acquisition scheduling/triggering engine 82 determines whether the trigger signal is internal or whether the trigger signal is external/manual. If internal, in step 189, acquisition scheduling/triggering engine 82 returns to the SWEEPING state. If external/manual, in step 190, acquisition scheduling/triggering engine 82 returns to the SWEEPING_NOT_TRIGGERED state.

Figure 8:
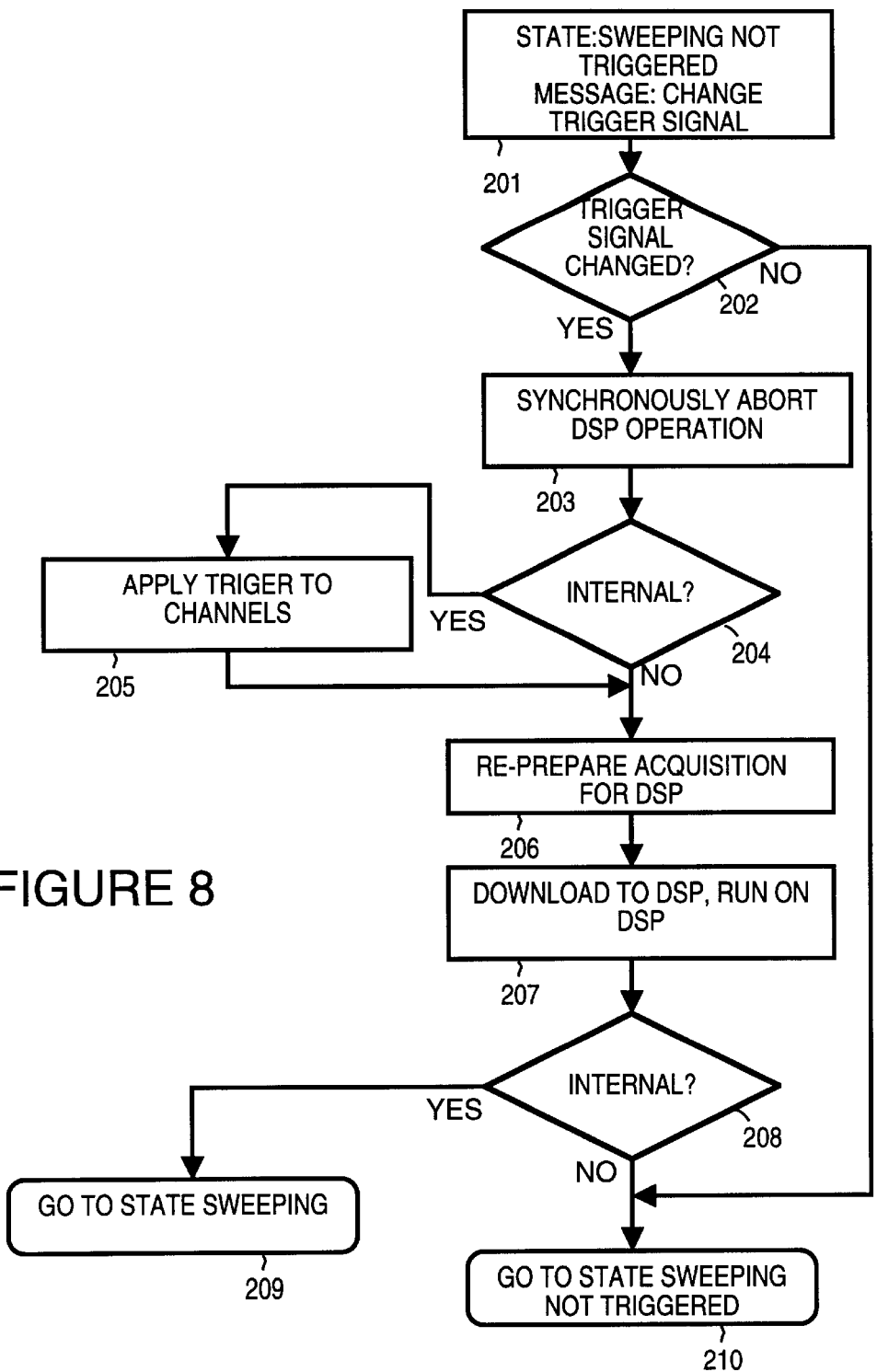

In FIG. 8, in a step 201, acquisition scheduling/triggering engine 82 is in the SWEEPING_NOT_TRIGGERED state and receives a CHANGE TRIGGER SIGNAL message from its queue. In a step 202, acquisition scheduling/triggering engine 82 determines whether the trigger signal has changed. If not, in a step 210, acquisition scheduling/triggering engine 82 returns to the SWEEPING_NOT_TRIGGERED state.

If in step 202, acquisition scheduling/triggering engine 82 determines the trigger signal has changed, in a step 203 acquisition scheduling/triggering engine 82 synchronously aborts the DSP operation. In a step 204, acquisition scheduling/triggering engine 82 determines whether the trigger signal is internal or whether the trigger signal is external/manual. If internal, in step 205, acquisition scheduling/triggering engine 82 applies the trigger to channel objects according to trigger type (global or channel object). If external/manual, step 205 is skipped.

In a step 206, acquisition scheduling/triggering engine 82 re-prepares acquisition for DSP based on the changed acquisition specification. In a step 207, acquisition scheduling/triggering engine 82 downloads to DSP and then runs on DSP. In a step 208, acquisition scheduling/triggering engine 82 determines whether the trigger signal is internal or whether the trigger signal is external/manual. If internal, in step 209, acquisition scheduling/triggering engine 82 goes to the SWEEPING state. If external/manual, in step 210, acquisition scheduling/triggering engine 82 returns to the SWEEPING_NOT_TRIGGERED state.

The channel objects group data acquisitions that are alike in how they must use instrument hardware 81. Each channel object stores the parts of the data acquisition (hardware stimulus data in particular, such as the frequency, power, and IF bandwidth) that are common to its one or more clients, of the data acquisition.

Once a channel object is created, it essentially performs as set out in Table 3 below:

TABLE 3

1) Wait for a client to request that data be acquired. By asking a particular channel object for data, the implication is that the client wants its data taken according to the channel object's hardware stimulus settings.
2) The channel object adds the data requests made by the client to a list.
3) As long as the list of data requests is not empty, channel object uses acquisition scheduling/triggering engine 82 to fulfill those requests according to the timesharing and triggering algorithm of acquisition scheduling/triggering engine 82.
4) When data is produced by acquisition scheduling/triggering engine 82, the channel object notifies its clients of the availability of that data. Clients will then normally retrieve the data. Availability of data does not affect the status of a client's data request, which remains in effect until revoked.
5) If the list of data requests is empty, the channel object does not use acquisition scheduling/triggering engine 82 (but the channel object's stimulus state remains preserved). This allows acquisition scheduling/triggering engine 82 to timeshare instrument hardware 81 more efficiently with other channel objects that have data requests to fulfill.
6) If a client revokes its data request, the data request is removed from channel object's list of such requests.

The interface between measurement objects and channel objects is implemented using a client/server relationship.

Measurement objects are clients, and channel objects are the servers. Each channel object can support an arbitrary number (N) of client objects (e.g., measurement objects). From the point of view of a measurement object, each channel object is capable of providing data acquired over a certain frequency range, with a certain power level, etc. The job of the measurement object is to process the raw acquired data provided by the channel object in some way that the user wants whenever the underlying channel object makes that data available, or whenever the measurement analysis specification is changed by the user. The analysis is, for example, a limit line test of the data, a time-domain transform analysis, an analysis with user calibration applied, or some combination of all of those or other analyses. Because the user of a network analyzer often want to perform multiple analyses on any given piece of acquired data, and because it takes time for instrument hardware 81 to acquire data, it increases efficiency to (where possible) share the data that has already been acquired.

Via the user interface for a network analyzer, a user creates a new measurement object, specifying from which channel object the measurement object should get raw acquired data. The user also specifies what is to be measured, such as an S-Parameter, arbitrary ratio, raw power, etc. The measurement object is created and requests the specified channel object to provide the specified measured data. The measurement object "subscribes" to the channel object so that the channel object will "notify" the measurement object when the requested measured data becomes available. (The channel object will also let any other measurement objects that are interested in this data know about it as well via the same mechanism.) The subscription mechanism provides information to the measurement object about the data buffer where the channel object will provide data as it becomes available, and information about the conditions under which the data was acquired (this is required for many of the measurement object analyses).

At this point, a default data analysis is constructed by the measurement object that can be later customized by the user. Each measurement object can be customized independently. When a channel object has new measurement data, each measurement object that is using that channel object as a data server is notified of this event, and proceeds to reapply its customized analysis to the data for the user. The analyzed result is also recomputed by the measurement object if it is customized by the user, such as changing the format, or time-domain gating window, applied calibration type, etc.

From the channel object point of view, its job is to fulfill data requests for its N clients. It provides a function to allow requests for such data, and a subscribe/notify mechanism to allow notifying clients when the asynchronously acquired data is available.

The display layer encapsulates data display related functions for the analyzer. From a data processing standpoint, this includes data placement and scaling factor calculations, as well as graticule and annotation rendering. Once again, there is a client/server type relationship in place, this time with one or more measurement objects as server(s) to one or more display window client(s). Note that this is slightly different than previous constructs in that the display window clients can make use of more than one measurement object servers. Thus can one window display can show data results from multiple different analyses. An abstract interface between the display window client and the measurement object server allows the display window client to display data produced by any measurement object. This allows the user to choose which window will display what data with no constraints. This can be useful in setting up displays for visual comparison of multiple related data analyses. For each measurement analysis that a display window object is asked to render, the display window object uses a trace sub-object to manage the interaction.

In the preferred embodiment, there are two uses of the display layer. The first use is invoked during the basic measurement object creation sequence. Table 4 below sets out activities performed during this sequence:

TABLE 4

1) The measurement object is created (see above).
2) A new display window object is created, or an existing display window object is selected.
3) The new or selected display window object is instructed to "view" the measurement object's results, and is given an abstract reference to the measurement object.
4) The display window object creates a trace sub-object, which subscribes to "data changes" in the measurement object. "Data changes" occur when newly acquired data is processed by the measurement object, or when the measurement analyses parameters are changed by the user.
5) The trace sub-object initially examines the analysis-result-contents of the measurement object, and constructs appropriate data structures for rendering those contents. For example, an array of swept data (a "trace") is rendered as a line, while individual markers (single preferred data points) are rendered as small triangles.

The second use of the display layer is represented by the "Arrange Windows" function. The purpose of this function is to alter the display of data (but not the analyses) to present the user with the same information in a way that is more conducive to intuitive visual analysis. Table 5 below sets out the activities occurring during the "Arrange Windows" function:

TABLE 5

1) Connections between all trace sub-objects and their parent display window object are severed.
2) Analysis is performed on various qualities of the measurement objects. The results of this analysis is a description of how trace sub-objects should be reassigned back to display window objects (possibly a different display window object than where it originated—the Arrange Windows function can create or remove display window objects depending on the user input).
3) Trace sub-objects are reassigned back to display window objects according to the Arrange Window analysis, which effectively determines in which display window object that trace sub-object (and the associated measurement object result data) is displayed.

Implementing arbitrary (N size) limits in the system requires the use of dynamic heap-based memory allocation. Run-time code is required to track and maintain these memory allocations. Saved instrument states also handle the N-ness of the system. For example, a system with a fixed number of channel objects might save information like this: Save State Info for channel object 1; Save State Info for channel object 2. Information is recalled using the following: Recall State Info for channel object 1; Recall State Info for channel object 2.

In the preferred embodiment of the present invention, there is not a fixed number of channel objects. Rather there is N channel objects, where N is a positive integer. Table 6 below sets out pseudo code for saving state information for channel objects and for recalling information for channel objects:

TABLE 6

To save channel object information:
    Save Number of channel objects currently active system.
    for( i = 0; i < Number of channel objects; i = i + 1)
    {
        Save State Info for channel object i.
    }
To recall channel object information:
Delete all channel objects in the system.
Read from file number of channel objects to recall from file (x).
    for( i = 0; i < x; i = i + 1)
    {
        Create a new channel object.
        Recall State Info for channel object i into that new channel object.
    }

In the present invention, the number of channel objects, the number of measurement objects and the number of window display objects are independently variable. The number of objects is limited only by memory size. One advantage of this arbitrary size system is that given a fixed amount of memory, the user can allocate memory for the optimal mix of objects to satisfy a given problem. For example, for one application, the optimal mix might be 8 channel objects, 8 measurement object, and 4 display windows. For another application, the optimal mix might be 4 channel objects, 12 measurement object, and 4 display windows. For another application the optimal mix might be 2 channel objects, 14 measurement objects, and 3 display windows. In each case, memory is allocated among object types to accommodate the optimal mix. This flexibility to re-partition of memory among different object layers is a significant advantage of the present invention.

In one preferred embodiment of the present invention, the electronic instrument is a network analyzer with 64 megabytes of random access memory (RAM). Approximately 12 to 15 megabytes of RAM are available to be partitioned among objects. In this system, a channel object is implemented using approximately five kilobytes of memory. A measurement object is implemented using approximately four to five hundred kilobytes of memory. A window display object is implemented using approximately four to five hundred kilobytes of memory. The memory required to implement each object can vary significantly depending upon data storage and processing requirements for each object.

From a user viewpoint, a great amount of flexibility is available both in generation and display of traces. For example, one channel object can be used by different measurement object to produce 4 traces all displayed various arrangements of windows.

Figure 9:
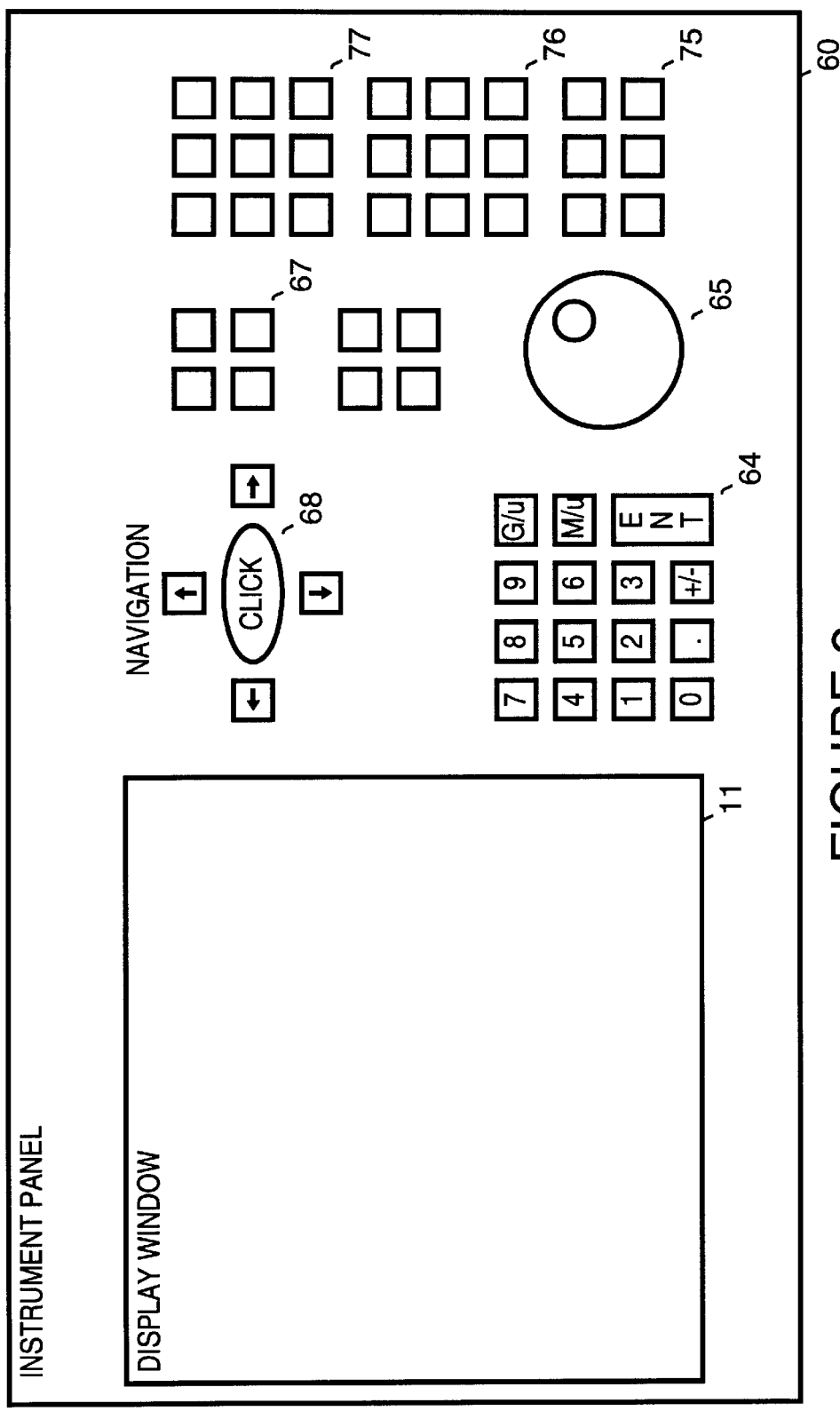
FIG. 9 is a simplified diagram of an instrument panel of an electronic instrument.

FIG. 9 is a simplified diagram of an instrument panel 60 of an electronic instrument. Instrument panel 60 includes an LCD display 11. LCD display 11 is capable of displaying multiple display windows. Instrument panel 60 also includes a navigation tool 68 consisting of hard keys. Navigation tool 68 can be utilized by a user as a point and select interface.

Instrument panel 60 additionally includes a numeric keypad 64 and a knob 65. Display hard keys 67 include a "Trace" key, a "Window" key, a "Measure/Setups" key and an "Arrange windows" key. Control hard keys 66 include an "OK" key, a "help" key, a "Cancel" key and a "Menu/Dialog" key.

Channel object setup hard keys 77 include a "Start/Center" key, a Stop/"Span" key, a "Power" key, a "Sweep Setup" key, a "channel object" key, a "Sweep Type" key, a "Trigger" key, an "Average" key and a "Calibrate" key.

Trace setup hard keys 76 include a "Measure" key, a "Format" key, a "Scale" key, a "Marker" key, a "Marker Table" key, a "Limit Table" key, a "Marker Search" key, a "Marker Function" key and a "Math/Memory" key.

Utility keys 75 include a "Save" key, a "Maximize" key, a "Preset" key, a "Recall" key, a "Print" key and a "Macro" key.

Table 7 below gives an example of four measurement objects defined by a user for display on display 11.

TABLE 7

| | Axis Format | Frequency Range | measurement object Path |
|---|---|---|---|
| Trace #1—S11 (Trace 17) | Circular | 10–500 MHz | Reflection |
| Trace #2—S21 (Trace 15) | Rectangular | 10–500 MHz | Transmission |
| Trace #3—S21 (Trace 14) | Rectangular | 10–1000 MHz | Transmission |
| Trace #4—S22 (Trace 13) | Rectangular | 10–500 MHz | Reflection |

The user can select a number of windows to be used to display the traces. Then the traces are distributed into a number of groups equal to the number of windows selected. Those traces that are most similar are grouped together. A set of attributes is used to determine which measurement objects are the most similar. When assigning similar traces to groups, some attributes are considered to be more important than others. When sorting is finished, all of the traces in a group are displayed together in one window.

Figure 10:
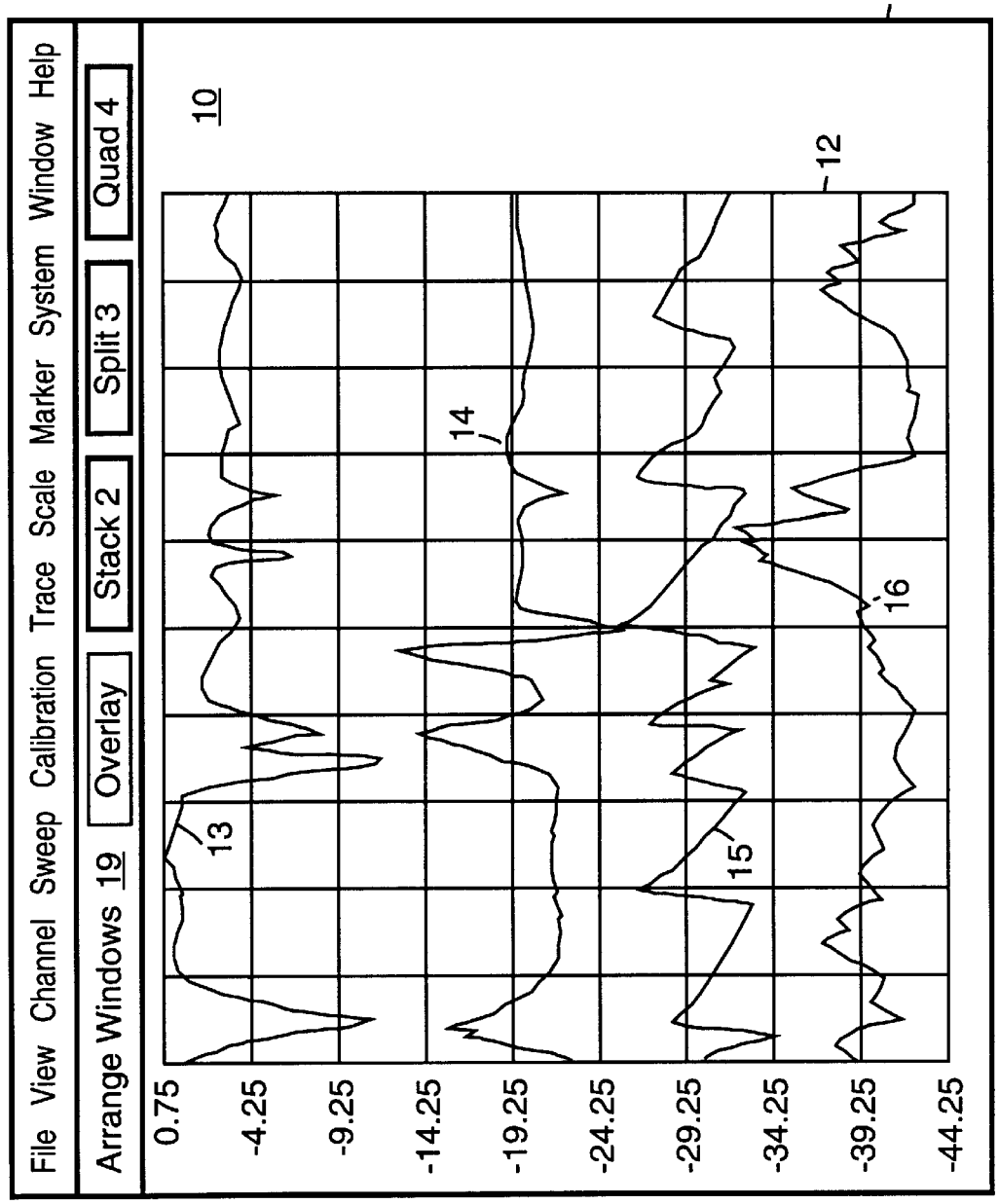
FIG. 10 shows a display window in which four traces are displayed.

For example, in FIG. 10, a display 11 shows the four traces displayed in a single window 10. A single window display is selected by the user by selecting an "Overlay" button on an arrange windows toolbar 19. A trace 13, a trace 14, a trace 15 and a trace 16 are shown relative to a rectangular graticule 12. Each trace representing different S11 measurements from a single channel (measuring 300 kHz to 9 GHz). Each measurement applies a different format (Log Magnitude, Group Delay, SWR, and Phase).

Figure 11:
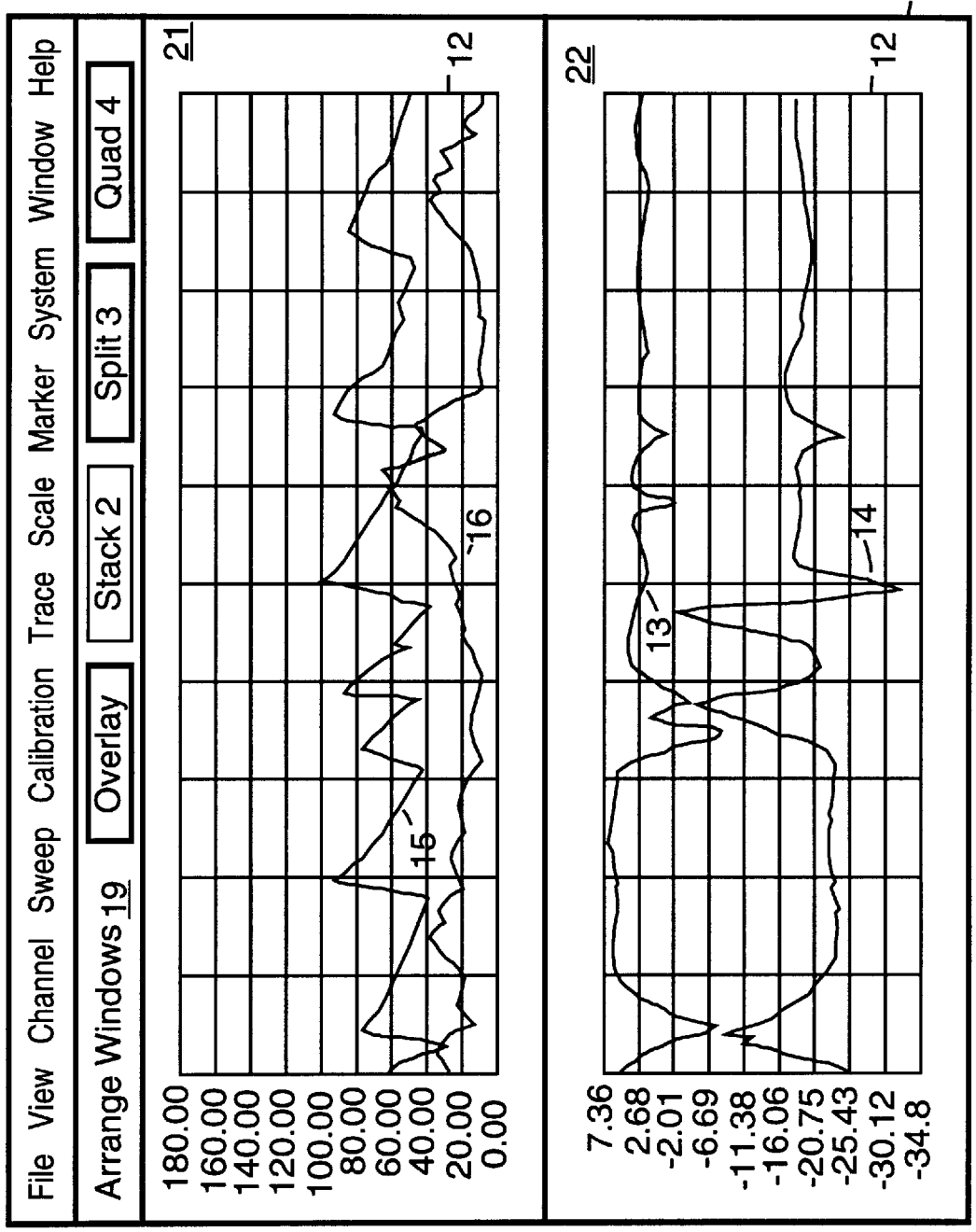
FIG. 11 shows a display window in which four traces have been sorted into two display windows in accordance with a preferred embodiment of the present invention.

In FIG. 11, display 11 shows the four traces displayed in two windows: window 21 and window 22. A split (two) window display is selected by the user by selecting a "Stack 2" button on arrange windows toolbar 19.

Figure 12:
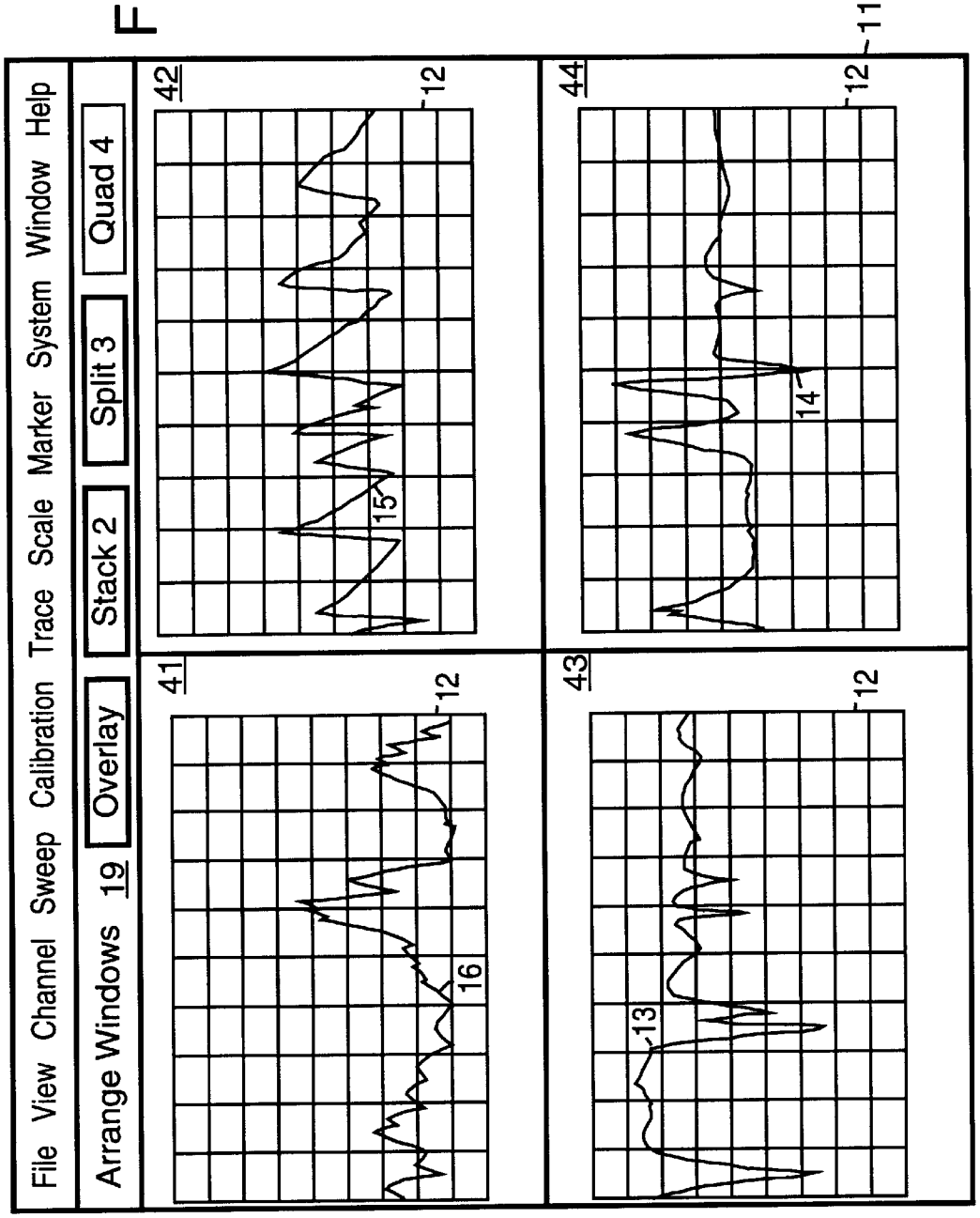
FIG. 12 shows a display window in which four traces have been sorted into four display windows in accordance with a preferred embodiment of the present invention.

In FIG. 12, display 11 shows the four traces displayed in four windows: window 41, window 42, window 43 and window 43. A four way split window display is selected by the user by selecting a "Quad 4" button on arrange windows toolbar 19.

In another example, four traces representing two channels with two measurements per channel can all be displayed in a single window. For example, channel 1 is a narrow band having a frequency from 30 MHz to 400 MHz. Channel 2 is a wide band having a frequency from 300 kHz to 9 GHz.

Alternatively, two windows can be used to display the measurements corresponding to like channels isolated from measurements in other channels. For example, the wide band is separated from the narrow band so that the narrowband response/rejection (in one window) of the measured filter can be separated from its wide band response (in the other window window).

The same four traces can be displayed in two windows, but with like S-Parameters (but with different Channel— freq. range) being grouped together for a different visual analysis. For example, Reflection (S11) measurements are displayed in one window, while transmission (S21) measurements are displayed in the other window.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. An electronic instrument comprising:
   instrument hardware;
   data acquisition engine, the data acquisition engine scheduling time sharing of the instrument hardware;
   a plurality of channel objects, each channel object acting as a client of the data acquisition engine, the channel objects each including a channel buffer that contains data obtained from the instrument hardware, wherein the plurality of channel objects time share use of the instrument hardware as scheduled by the data acquisition engine; and,
   a plurality of measurement objects, each measurement object being a client of one of the plurality of channel objects, each measurement object processing data within a channel buffer of a channel object to which the measurement object is a client.

2. An electronic instrument as in claim 1, additionally comprising:
   a plurality of display window objects, each display window object being a client of at least one of the plurality of measurement objects, each display window object displaying data processed by any measurement object to which the display window object is a client.

3. An electronic instrument as in claim 1 wherein the instrument hardware performs hardware functions for a network analyzer.

4. An electronic instrument as in claim 1 wherein the data acquisition engines operates in three different states: an idle state, a sweeping state and a sweeping not triggered state.

5. An electronic instrument as in claim 1 wherein the data acquisition engine translates client requests for data into a command queue which is used to generate hardware control signals and data digitization operations.

6. An electronic instrument as in claim 1 wherein each channel object can support an arbitrary number of measurement objects.

7. An electronic instrument as in claim 1 wherein each measurement object subscribes to a channel object so that the channel object will notify the measurement object when requested measured data becomes available.

8. An electronic instrument as in claim 1, additionally comprising:
   a plurality of display window objects, at least one display window object being a client of more than one of the plurality of measurement objects, and wherein at least one measurement object has more than one display window objects as clients.

9. An electronic instrument as in claim 1, wherein memory within the electronic instrument is allocated among object types to accommodate a user specified mix of object types.

10. An electronic instrument as in claim 1 wherein channel objects set policy on whether and when to accept triggers from the data acquisition engine.

11. An electronic instrument as in claim 10 wherein each channel object is set at one of the following policy levels:
    a policy level in which the channel object is not triggerable;
    a policy level in which the channel object accepts one trigger;
    a policy level in which the channel object accepts a set number of triggers; and,
    a policy level in which the channel object always accepts triggers.

12. A method for acquiring data from instrument hardware, the method comprising the following steps:
    (a) scheduling time sharing of the instrument hardware by a data acquisition engine;
    (b) placing data obtained from the instrument hardware into channel buffers, the data being placed into each channel buffer by a channel object associated with the channel buffer, each channel object acting as a client of the data acquisition engine, wherein channel objects time share use of the instrument hardware as scheduled by the data acquisition engine; and,
    (c) processing data within a channel buffer of a channel object, the data being processed by a measurement object which is a client of the channel object.

13. A method as in claim 12, additionally comprising the following step:
    (d) displaying data processed by the plurality of measurement objects, the data being displayed by display window objects, each display window object being a client of at least one of the plurality of measurement objects.

14. A method as in claim 12 wherein the electronic instrument is a network analyzer.

15. A method as in claim 12 wherein in step (a) the data acquisition engine operates in three different states: an idle state, a sweeping state and a sweeping not triggered state.

16. A method as in claim 12 wherein step (a) includes the following substep:
    translating, by the data acquisition engine, client requests for data into a command queue which is used to generate hardware control signals and data digitization operations.

17. A method as in claim 12 wherein in step (c) each channel object can support an arbitrary number of measurement objects.

18. A method as in claim 12 wherein step (c) includes the following substep:
    subscribing to a channel object, by each measurement object, so that the channel object will notify the measurement object when requested measured data becomes available.

19. A method as in claim 12, additionally comprising the following step:
    displaying data processed by the plurality of measurement objects, the data being displayed by display window objects, each display window object being a client of at least one of the plurality of measurement objects, wherein at least one measurement object has more than one display window objects as clients.

20. A method as in claim 12, additionally including the following step:
    (d) allocating memory within the electronic instrument among object types to accommodate a user specified mix of object types.

21. Storage media used to store software, which when executed, performs a method for acquiring data from instrument hardware, the method comprising the following steps:

(a) scheduling time sharing of the instrument hardware by a data acquisition engine;

(b) placing data obtained from the instrument hardware into channel buffers, the data being placed into each channel buffer by a channel object associated with the channel buffer, each channel object acting as a client of the data acquisition engine, wherein channel objects time share use of the instrument hardware as scheduled by the data acquisition engine; and, (c) processing data within a channel buffer of a channel object, the data being processed by a measurement object which is a client of the channel object.

22. Storage media as in claim 21, wherein the method additionally comprises the following step:

(d) allocating memory within the electronic instrument among object types to accommodate a user specified mix of object types.

* * * * *